(12) United States Patent
Fujiwara et al.

(10) Patent No.: US 8,018,737 B2
(45) Date of Patent: Sep. 13, 2011

(54) CONNECTING STRUCTURE OF CIRCUIT BOARD, CONNECTING PART OF CIRCUIT BOARD AND ELECTRONIC DEVICE

(75) Inventors: Yoshihito Fujiwara, Kanagawa (JP); Masahito Kawabata, Kanagawa (JP)

(73) Assignee: Panasonic Corporation, Osaka (JP)

( * ) Notice: Subject to any disclaimer, the term of this patent is extended or adjusted under 35 U.S.C. 154(b) by 637 days.

(21) Appl. No.: 12/097,960

(22) PCT Filed: Dec. 22, 2005

(86) PCT No.: PCT/JP2005/023667
§ 371 (c)(1),
(2), (4) Date: Jun. 18, 2008

(87) PCT Pub. No.: WO2007/072570
PCT Pub. Date: Jun. 28, 2007

(65) Prior Publication Data
US 2009/0176384 A1    Jul. 9, 2009

(51) Int. Cl.
*H05K 1/14* (2006.01)
*H05K 1/00* (2006.01)
(52) U.S. Cl. ........ 361/803; 361/784; 174/254; 174/260; 174/261
(58) Field of Classification Search .................. None
See application file for complete search history.

(56) References Cited

U.S. PATENT DOCUMENTS

| | | | | |
|---|---|---|---|---|
| 5,920,465 A | * | 7/1999 | Tanaka | 361/784 |
| 5,936,850 A | * | 8/1999 | Takahashi et al. | 361/784 |
| 5,978,060 A | * | 11/1999 | Nakawaki et al. | 349/150 |
| 6,201,689 B1 | * | 3/2001 | Miyasyo | 361/679.54 |
| 6,583,990 B2 | * | 6/2003 | Serizawa et al. | 361/749 |
| 6,717,062 B2 | * | 4/2004 | Nakamura et al. | 174/257 |
| 7,286,370 B2 | * | 10/2007 | Ooyabu | 361/803 |
| 7,413,452 B2 | * | 8/2008 | Jeong et al. | 439/91 |
| 7,544,897 B2 | * | 6/2009 | Kobayashi | 174/254 |

FOREIGN PATENT DOCUMENTS

| | | |
|---|---|---|
| JP | 09-162544 | 6/1997 |
| JP | 11-007040 | 1/1999 |
| JP | 2002-151821 | 5/2002 |
| JP | 2003-133677 | 5/2003 |

OTHER PUBLICATIONS

International Search Report Dated Feb. 21, 2006.

* cited by examiner

*Primary Examiner* — Boris L Chervinsky
(74) *Attorney, Agent, or Firm* — Seed IP Law Group PLLC

(57) ABSTRACT

The invention provides a connecting structure of a circuit board, a connecting part of the circuit board, and an electronic device capable of alleviating a temperature difference between the connecting parts under hot pressure welding. A connecting structure 10 of a circuit board comprises a first circuit board 11 and a second circuit board 12, with a first connecting part 15 and a second connecting part 16 opposedly disposed via an adhesive 13. The first connecting part 15 and the second connecting part 16 are pinched by a pair of pressurizing jigs 20 and subjected to hot pressure welding so that first circuit patterns 17 and second circuit patterns 18 are in contact with each other. In the connecting structure 10 of the circuit board, the first circuit board 11 is a soft base material 21, and a heat-insulating layer 28, having lower thermal conductivity than the soft base material 21, is provided on only a part 27 of the region corresponding to the first connecting part 15 on the rear surface 21B of the soft base material 21.

6 Claims, 10 Drawing Sheets

CONNECTING STRUCTURE OF CIRCUIT BOARD, CONNECTING PART OF CIRCUIT BOARD AND ELECTRONIC DEVICE

TECHNICAL FIELD

The present invention relates to a connecting structure of a circuit board subjected to hot pressure welding with an adhesive interposed between the connecting part of a first circuit board and connecting part of a second circuit board, a connecting part of each of the circuit boards forming the connecting structure of the circuit board, and an electronic device using the connecting structure of the circuit board.

BACKGROUND ART

For example, in a portable terminal such as a cell phone, the connecting part of a hard circuit board is coupled to the connecting part of a soft circuit board in an enclosure. The connecting parts of these circuit boards are shown in FIG. 9.

A first circuit board 100 includes a mounting part 102 where numerous electronic components are mounted along the surface of a soft base material 101 and a connecting part 104 where a plurality of circuit patterns 103 are arranged in parallel adjacent to the mounting part 102, the mounting part 102 covered with a resist or a coverlay.

A second circuit board 106 includes a mounting part 108 where numerous electronic components are mounted along the surface of a hard base material 107 and a connecting part 110 where a plurality of circuit patterns 109 are arranged in parallel adjacent to the mounting part 108, the mounting part 108 covered with a resist or a coverlay.

To connect the first circuit board 100 and the second circuit board 106 to each other, respective connecting parts 104, 110 are opposedly disposed via an adhesive, and the connecting parts 104, 110 are pinched by the upper mold 113 and lower mold 114 of a pressurizing jig 112 thus subjected to hot pressure welding.

The first circuit board 100 and the second circuit board 106 are fixed together while the adhesive extruded from between the opposed circuit patterns 103, 109 under hot pressure welding bonds the soft base material 101 and the hard base material 107 to each other and the circuit patterns 103, 109 on the connecting parts 104, 110 are thus in face contact to each other.

On the first circuit board 100, the mounting part 102 and the connecting part 104 are arranged in an L shape in displaced positions from each other rather than a belt shape where the mounting part 102 and the connecting part 104 are arranged in a linear shape in order to support a compact, lower-profile enclosure design.

Similarly, on the second circuit board 106, the mounting part 108 and the connecting part 110 are arranged in an L shape in displaced positions from each other rather than a belt shape where the mounting part 108 and the connecting part 110 are arranged in a linear shape in order to support a compact, lower-profile enclosure design.

Thus, as shown in FIG. 10, when the first circuit board 100 and the second circuit board 106 are connected to each other, the heat in a section 116 of the connecting parts 104, 110 subjected to hot pressure welding that is close to the hard base material 107 is transmitted as shown by an arrow A. On the other hand, the heat in a section 117 distant from the hard base material 107 is unlikely to be transmitted as shown by an arrow B. Thus, the section 117 distant from the hard base material 107 is likely to confine heat.

In this example, heat is unlikely to be transmitted to the soft base material 101 and is likely to be transmitted to the hard base material 107.

In this case, the heat transmitted to the connecting parts 104, 110 are uneven, thus causing a temperature difference between the section 117 distant from the hard base material 107 and the section 116 close to the hard base material 107.

That is, the section 117 distant from the hard base material 107 is a high-temperature section while the section 116 close to the hard base material 107 is a low-temperature section.

As a result, the soft base material 101 may be excessively softened in part and is unnecessarily drawn by pressurization. This may lead to displacement of the circuit patterns 103, 109 in the high-temperature section 117 (refer to FIG. 9) or failure to obtain necessary bonding strength due to uneven hard bodies in the adhesive.

To solve the problems, there has been proposed a method for manufacturing a liquid crystal display device for keeping at room temperatures or cooling the surface of one mold out of a pair of molds 113, 114 constituting a pressurizing jig 112 (refer to FIG. 9) (see Patent Reference 1).
[Patent Reference 1] JP-A-11-7040

DISCLOSURE OF THE INVENTION

Problems that the Invention is to Solve

In Patent Reference 1, while the surface of one mold is kept at room temperatures or cooled, the temperature difference between the connecting part 104 of the first circuit board 100 and the connecting part 110 of the second circuit board 106 is not alleviated, which is not a radical solution.

The invention has been accomplished to solve the problems. An object of the invention is to provide a connecting structure of a circuit board, a connecting part of the circuit board, and an electronic device capable of alleviating a temperature difference between the connecting parts under hot pressure welding.

Means for Solving the Problems

The invention provides a connecting structure of a circuit board comprising a first circuit board and a second circuit board each including a connecting part where plural circuit patterns are arranged in parallel on a front surface of a base material, wherein the connecting parts are opposedly disposed via an adhesive and the connecting parts are pinched by a pair of pressurizing jigs for hot pressure welding of the connecting parts so that the circuit patterns are in contact with each other, wherein one of the boards is a soft base material; and wherein a heat-insulating layer, which has lower thermal conductivity than the soft base material, is provided on only a part of a region corresponding to the connecting part on a rear surface of the soft base material.

One of the boards is a soft base material and a heat-insulating layer is arranged only in a part of the region corresponding to the connecting part on the rear surface of the soft base material. The heat-insulating layer has lower thermal conductivity than the soft base material.

By arranging the heat-insulating layer in a part of the region corresponding to the connecting part, it is possible to provide a heat-insulating layer in a section where heat is likely to be confined.

It is thus possible to use a heat-insulating layer to reduce the thermal conductivity to a section where heat is likely to be confined under hot pressure welding using a pressurizing jig.

This suppresses, by using the heat-insulating layer, a rise in temperature of a section where heat is likely to be confined thus alleviating a temperature difference between connecting parts under hot pressure welding.

The heat-insulating layer may be a film-shaped coverlay bonded with an adhesive or a coating of a liquid resist.

The heat-insulating layer includes a laminate of coverlays or repeated coating of a resist.

In the invention, the heat-insulating layer has an uneven thickness dimension.

Heat is not confined evenly in a section where heat is likely to be confined. By designing the heat-insulating layer adjustable to an uneven thickness dimension, it is possible to appropriately change thermal conductivity and more favorably alleviate a temperature difference between the connecting parts.

The uneven thickness dimension is adjusted in a phased manner by molding a stepped heat-resisting layer or with the amount of application of an adhesive.

Adjustment using an adhesive refers to a process of gradually applying an adhesive more than once, same as the resist.

In the invention, a slit is formed in the soft base material so as to correspond to the end of the heat-insulating layer.

By forming a slit so as to correspond to the end of the heat-insulating layer, heat is shielded by the slit and kept from being transmitted to a section where heat is likely to be confined. This more favorably alleviates a temperature difference between the connecting parts.

In the presence of uneven extension of a connecting part due to variations in temperature under hot pressure welding, extension of the connecting part is absorbed by the slit.

This prevents accumulation of extension of the connecting part thus suppressing displacement of circuit patterns.

The connecting part of the circuit board according to the invention is the connecting part of the circuit board where plural circuit patterns are arranged in parallel on the front surface of a soft base material, and a heat-insulating layer, having lower thermal conductivity than the soft base material, is provided on only a part of the region corresponding to the connecting part on the rear surface of the soft base material.

An electronic device according to the invention uses the above-mentioned connecting structure of the circuit board.

Advantage of the Invention

The invention uses a heat-insulating layer to reduce the thermal conductivity to a section where heat is likely to be confined under hot pressure welding by way of a pressurizing jig. Thus, rise in temperature of the section where heat is likely to be confined is suppressed.

This alleviates a temperature difference between the connecting parts, prevents circuit patterns from being displaced and suppresses variations in temperature of heat transmitted to an adhesive.

DESCRIPTION OF REFERENCE NUMERALS AND SIGNS

Figure 1:
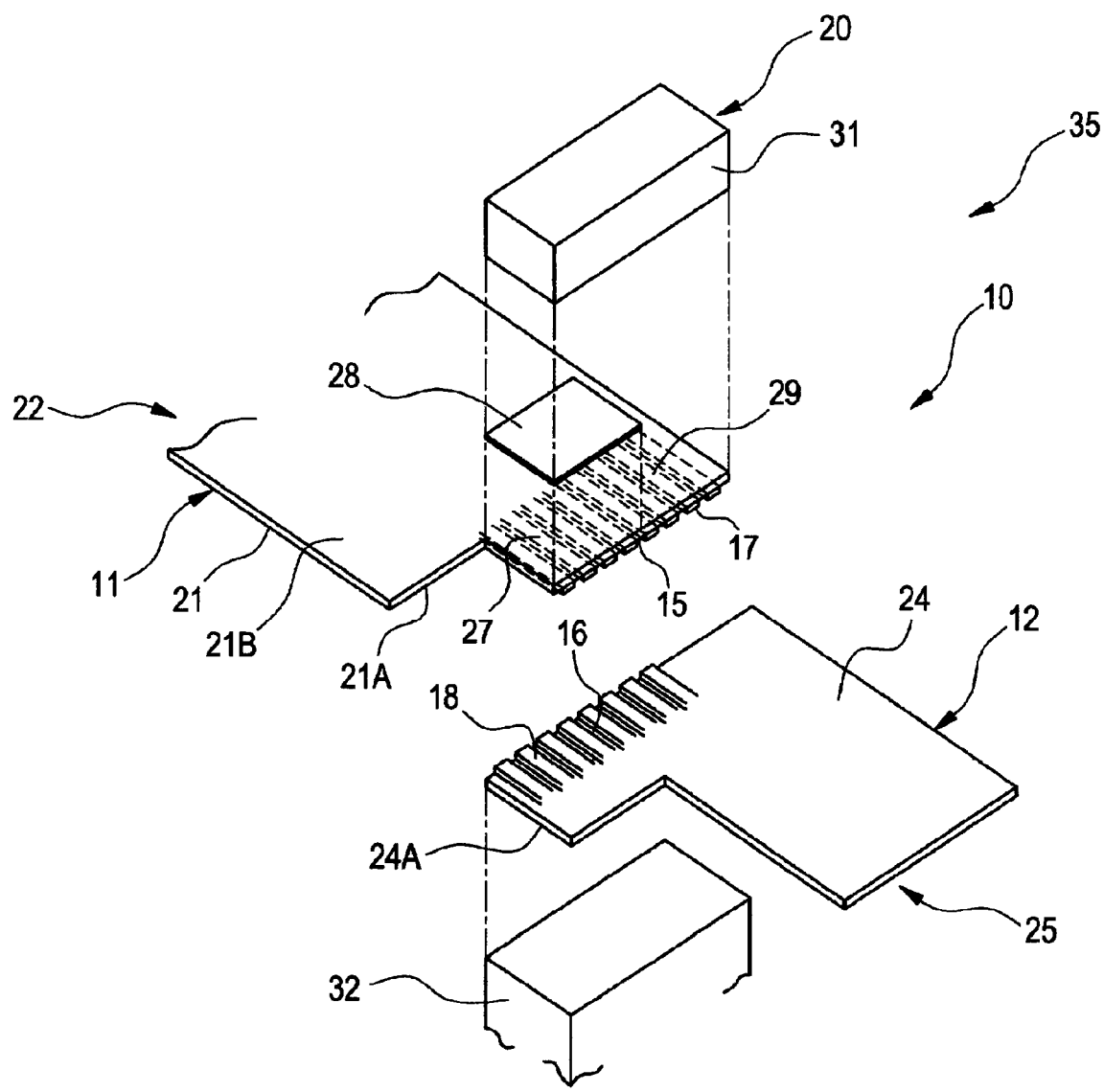
FIG. 1 is an exploded perspective view of a connecting structure of a circuit board according to a first embodiment of the invention.

10, 40, 50, 60: Connecting structure of a circuit board
11: First circuit board
12: Second circuit board
13: Adhesive
15: First connecting part (connecting part)
16: Second connecting part (connecting part)
17: First circuit pattern (circuit pattern)
18: Second circuit pattern (circuit pattern)
20: Pressurizing jig
21: Soft base material (base material)
21A: Front surface of the soft base material
21B: Rear surface of the soft base material
24: Hard base material (base material)
27: Part of the region corresponding to the first connecting part (part of the region corresponding to the connecting part)
28, 41, 51: Heat-insulating layer
28A: End of the heat-insulating layer
35: Electronic device
61: Slit

BEST MODE FOR CARRYING OUT THE INVENTION

First Embodiment

Figure 2A:
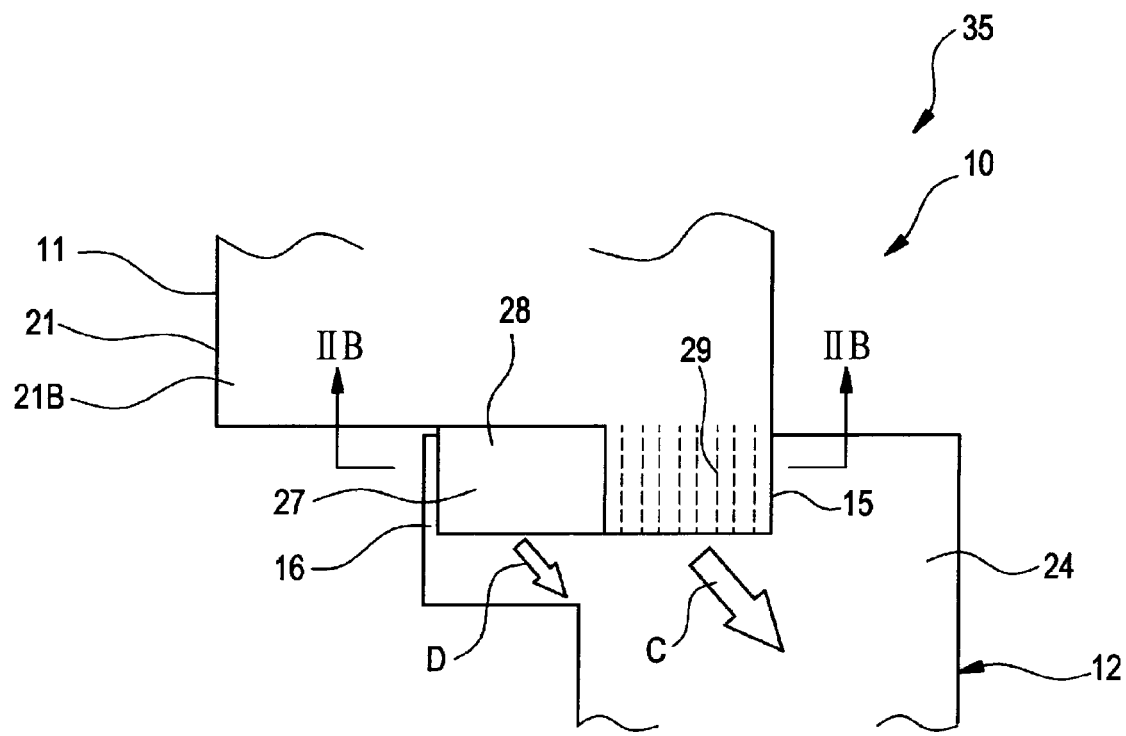
FIG. 2A is a plan view of the connecting structure of the circuit board according to the first embodiment of the invention.
Figure 2B:
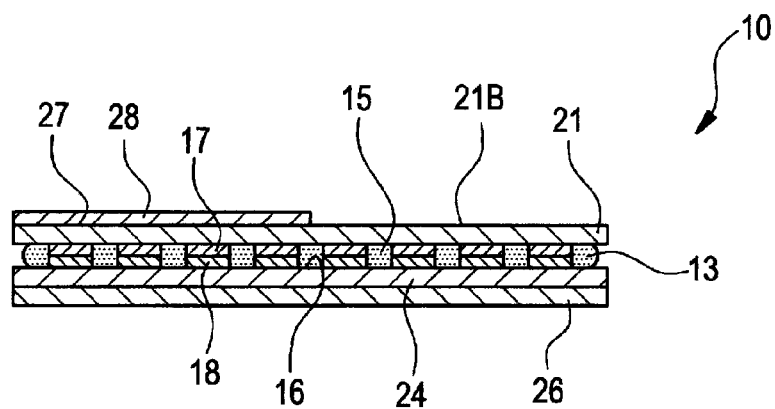
FIG. 2B is a cross-sectional view of FIG. 2A.

As shown in FIGS. 1 and 2, a connecting structure 10 of a circuit board according to a first embodiment includes a first circuit board 11 and a second circuit board 12. The first connecting part (connecting part) 15 of the first circuit board 11 and the second connecting part (connecting part) 16 of the second circuit board 12 are opposedly disposed via an adhesive 13 (refer to FIG. 2B) and the first connecting part 15 and the second connecting part 16 are pinched by a pair of pressurizing jigs 20 and subjected to hot pressure welding so that the first circuit patterns (circuit patterns) 17 on the first circuit board 11 and the second circuit patterns (circuit patterns) 18 on the second circuit board 12 are in contact with each other.

The first circuit board 11 includes a mounting part 22 where numerous electronic components are mounted along the front surface 21A of a soft base material (base material) 21 and a first connecting part 15 where a plurality of first circuit patterns 17 are arranged in parallel adjacent to the mounting part 22 on the front surface 21A of the soft base material 21, the mounting part 22 covered with a resist or a coverlay.

The second circuit board 12 includes a mounting part 25 where numerous electronic components are mounted along the front surface 24A of a hard base material (base material) 24 and a second connecting part 16 where a plurality of second circuit patterns 18 are arranged in parallel adjacent to the mounting part 25 on the front surface 24A of the hard base material 24, the mounting part 25 covered with a resist or a coverlay 26 (refer to FIG. 2B).

Each of the first circuit board 11 and the second circuit board 12 may be made of a film base material containing as a base an organic material such as epoxy, polyimide, liquid crystal polymer, BT resin, or PEEK, etc. The thickness of one film base material is 10 to 100 μm.

Each of the first circuit board 11 and the second circuit board 12 is a substrate made of a single layer of a film base material or two, four, six, and more layers, thereof laminated together, with inner wiring (rolled or electrolytic Cu foil) 10 to 20 μm thick and outer wiring (Ni- or Au-plated Cu) 10 to 35 μm thick formed thereon and having a total thickness of 20 to 500 μm.

The connecting structure 10 of this circuit board includes a heat-insulating layer 28 only in a part 27 of the region corresponding to the first connecting part 15 on the rear surface 21B of the soft base material 21.

An example of the heat-insulating layer 28 is a coverlay layer or a resist layer formed in a rectangular shape and having lower thermal conductivity than the soft base material 21.

The first connecting part 15 is the connecting part of the circuit board.

The heat-insulating layer 28 may be a film-shaped coverlay or a liquid resist.

An example of a resist is a liquid ink containing a photosensitive thermosetting epoxy resin or a urethane-modified epoxy resin.

An example of a cover lay is made of a film containing polyimide as a base bonded with a thermosetting adhesive such as epoxy.

An example of an adhesive is a pasty adhesive containing epoxy resin, acrylic resin, imide resin, or silicone resin as a base resin.

"A part of the region corresponding to the connecting part" 27 will be described.

On the first circuit board 11, the first mounting part 22 and the first connecting part 15 are arranged in an L shape in displaced positions from each other rather than a belt shape where the first mounting part 22 and the first connecting part 15 are arranged in a linear shape in order to support a compact, lower-profile design of the enclosure of an electronic device 35.

Similarly, on the second circuit board 12, the second mounting part 25 and the second connecting part 16 are arranged in an L shape in displaced positions from each other rather than a belt shape where the second mounting part 25 and the second connecting part 16 are arranged in a linear shape.

Thus, when the first circuit board 11 and the second circuit board 12 are connected to each other, the heat in a section 29 of the first connecting part 15 and second connecting part 16 subjected to hot pressure welding that is close to the hard base material 24 is transmitted as shown by an arrow C. On the other hand, the heat in a section (a part of the region corresponding to the connecting part) 27 distant from the hard base material 24 is unlikely to be transmitted as shown by an arrow D. Thus, the section 27 distant from the hard base material 24 is likely to confine heat.

Thus, the section 27 distant from the hard base material 24 is assumed as "a part of the region corresponding to the connecting part" and the heat-insulating layer 28 is arranged in this section 27.

Next, a process of performing hot pressure welding on the first circuit board 11 and the second circuit board 12 of the connecting structure 10 of the circuit board will be described.

When the first connecting part 15 of the first circuit board 11 and the second connecting part 16 of the second circuit board 12 are connected to each other, the first connecting part 15 and the second connecting part 16 are opposedly disposed via an adhesive 13.

An upper mold 31 and a lower mold 32 (refer to FIG. 2) of a pressurizing jig 20 are set to a predetermined temperature. The first connecting part 15 and the second connecting part 16 are heated and pressure-welded to each other while pinched by the upper mold 31 and the lower mold 32.

The temperature of the adhesive 13 peaks at 100 to 250° C. and the hot pressure welding time is 2 to 20 seconds. The hot pressure welding hardens the adhesive 13 and connects the first connecting part 15 and the second connecting part 16 to each other.

The soft base material 21 of the first connecting part 15 and the hard base material 24 of the second connecting part 16 are bonded to each other by the adhesive 13 extruded from between the first circuit patterns 17 and the second circuit patterns 18 opposed to each other while hot pressure welding is on the way.

This fixes the first circuit patterns 17 and the second circuit patterns 18 in a face contact state.

On the rear surface 21B of the soft base material 21, a heat-insulating layer 28 is arranged only in a part 27 of the region corresponding to the first connecting part 15, that is, in the section 27 distant from the hard base material 24. The heat-insulating layer 28 is a layer having lower thermal conductivity than the soft base material 21.

The section 27 distant from the hard base material 24 is a section where heat is likely to be confined.

It is thus possible to reduce, by way of the heat-insulating layer 28, the thermal conductivity to the section 27 distant from the hard base material 24, that is, the section 27 where heat is likely to be confined when heating and pressure-welding the first connecting part 15 and the second connecting part 16 to each other with the pressurizing jig 20.

This makes it difficult for the heat from the pressurizing jig 20 to be transmitted to the section 27 distant from the hard base material 24. This suppresses a rise in temperature in the section 27 distant from the hard base material 24 thus alleviating a temperature difference between the first connecting part 15 and the second connecting part 16.

This prevents the first circuit patterns 17 and the second circuit patterns 18 from being displaced and suppresses variations in temperature of heat transmitted to the adhesive 13.

By using the connecting structure 10 of the circuit board thus configured in an electronic device 35, it is possible to downsize and reduce the thickness of an enclosure and obtain the compact, low-profile electronic device 35.

A connecting structure of a circuit board according to a second to a fourth embodiments will be described based on FIGS. 3 to 8.

In the second to fourth embodiments, an identical or similar component to that in the first embodiment is given a same sign and corresponding description is omitted.

Second Embodiment

Figure 3:
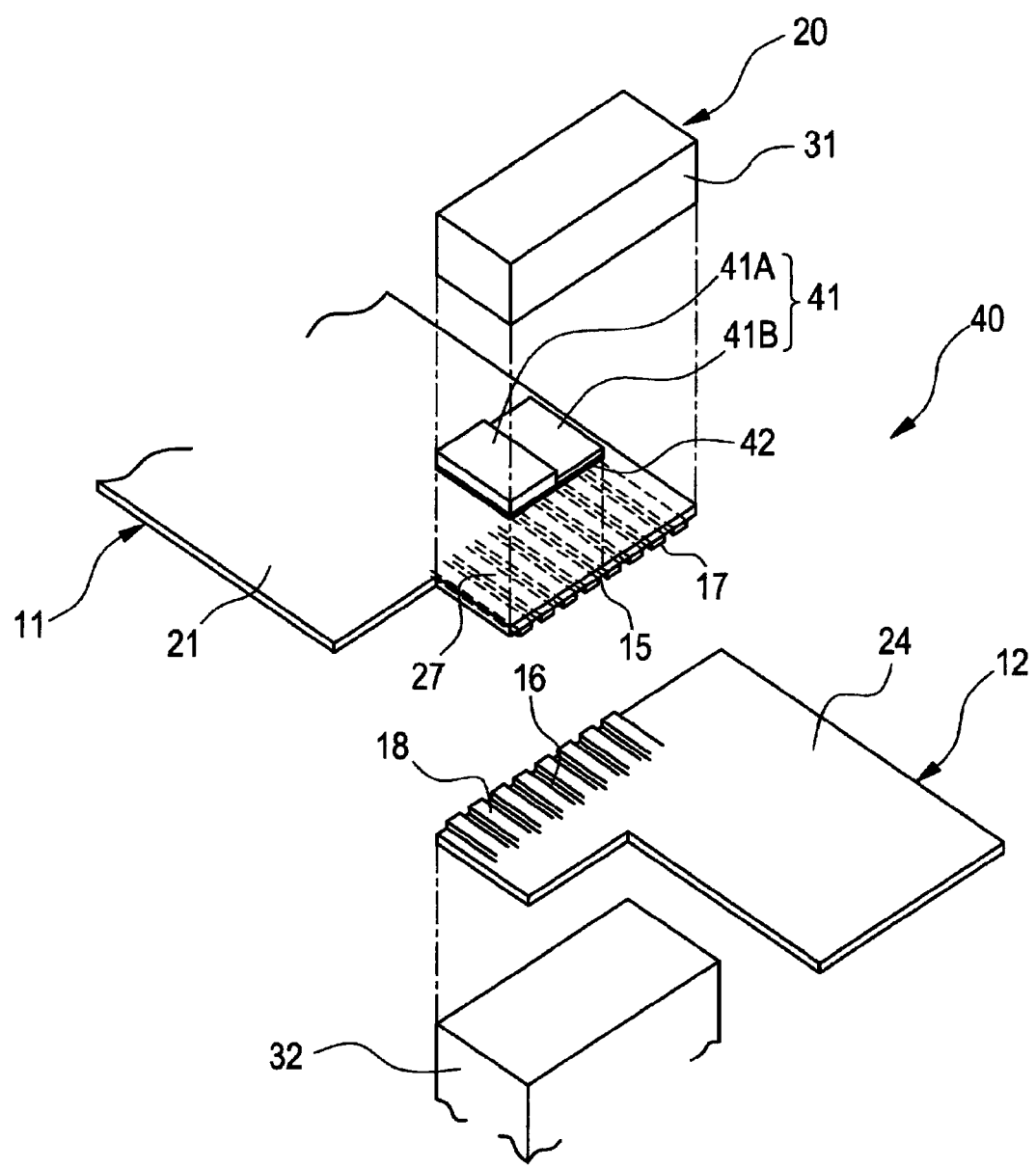
FIG. 3 is an exploded perspective view of a connecting structure of a circuit board according to a second embodiment of the invention.
Figure 4A:
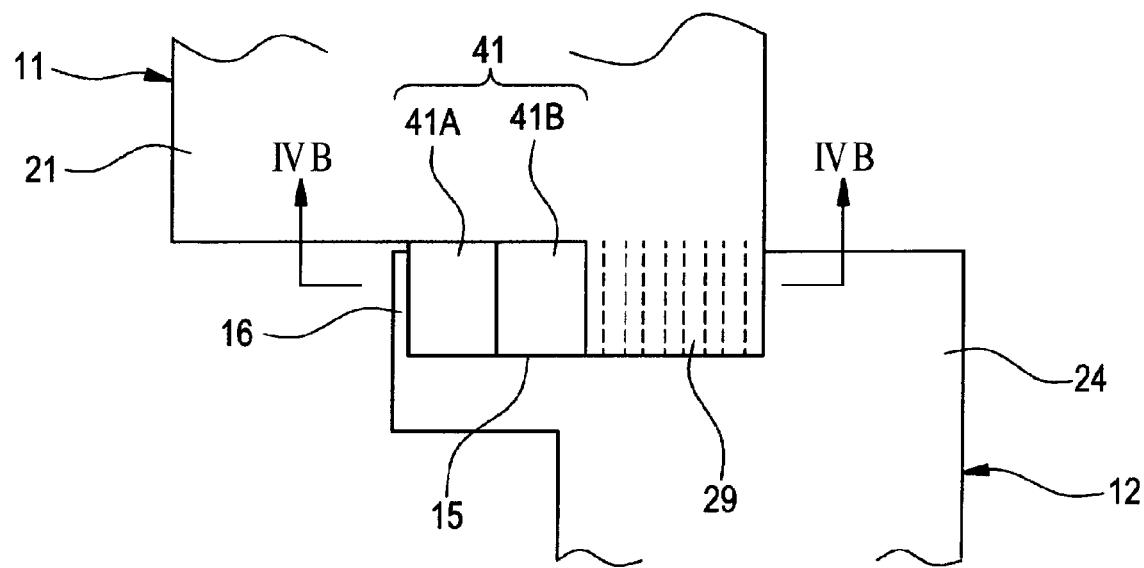
FIG. 4A is a plan view of the connecting structure of the circuit board according to the second embodiment of the invention.
Figure 4B:
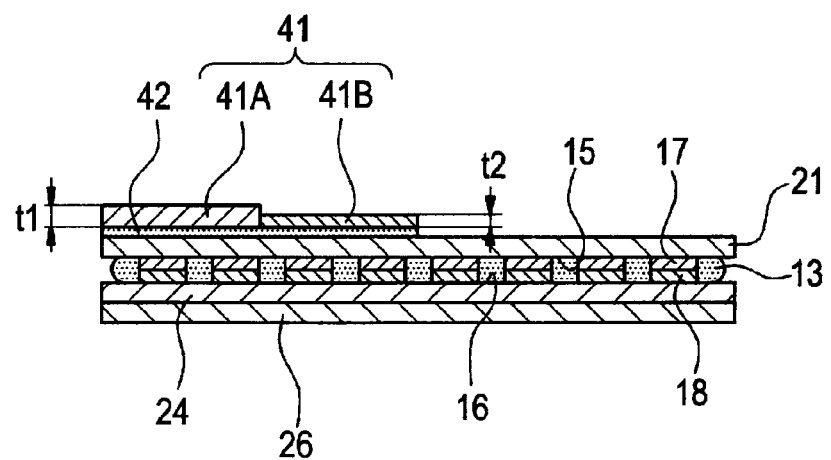
FIG. 4B is a cross-sectional view of FIG. 4A.

As shown in FIGS. 3 and 4, a connecting structure 40 of a circuit board according to the second embodiment uses a heat-insulating layer 41 instead of the heat-insulating layer 28 of the first embodiment. The other configuration is the same as that of the connecting structure 10 of the circuit board according to the first embodiment.

When the first connecting part and the second connecting part are heated and pressure-welded to each other, heat may be confined unevenly in the section 27 where heat is likely to be confined. The heat-insulating layer 41 is thus adjusted to have an uneven thickness dimension.

In particular, the heat-insulating layer 41 includes, for example, a coverlay 41A having a thickness dimension t1 and a coverlay 41B having a thickness dimension t2 respectively bonded to the section 27 where heat is likely to be confined with an adhesive 42. The thickness dimension t1 is larger than the thickness dimension t2 (t1>t2).

With this arrangement, the heat-insulating layer 41 can change its thickness dimension in two steps.

The reason the thickness dimension t1 of the coverlay 41A is made larger than the thickness dimension t2 of the coverlay 41B is as follows:

The section where the coverlay 41A is disposed is more distant from the hard base material 24 than the section where the coverlay 41B is disposed. Thus, the section where the coverlay 41A is disposed is more likely to confine heat than the section where the coverlay 41B is disposed.

This is the reason the thickness dimension t1 of the coverlay 41A is made larger than the thickness dimension t2 of the coverlay 41B.

By designing the heat-insulating layer 41 adjustable to an uneven thickness dimension, it is possible to change thermal conductivity in a phased manner and more favorably alleviate a temperature difference between the first connecting part 15 and the second connecting part 16.

It is thus possible to more favorably prevent the first circuit patterns 17 and the second circuit patterns 18 from being displaced and more favorably suppress variations in temperature of heat transmitted to an adhesive 13.

Third Embodiment

Figure 5:
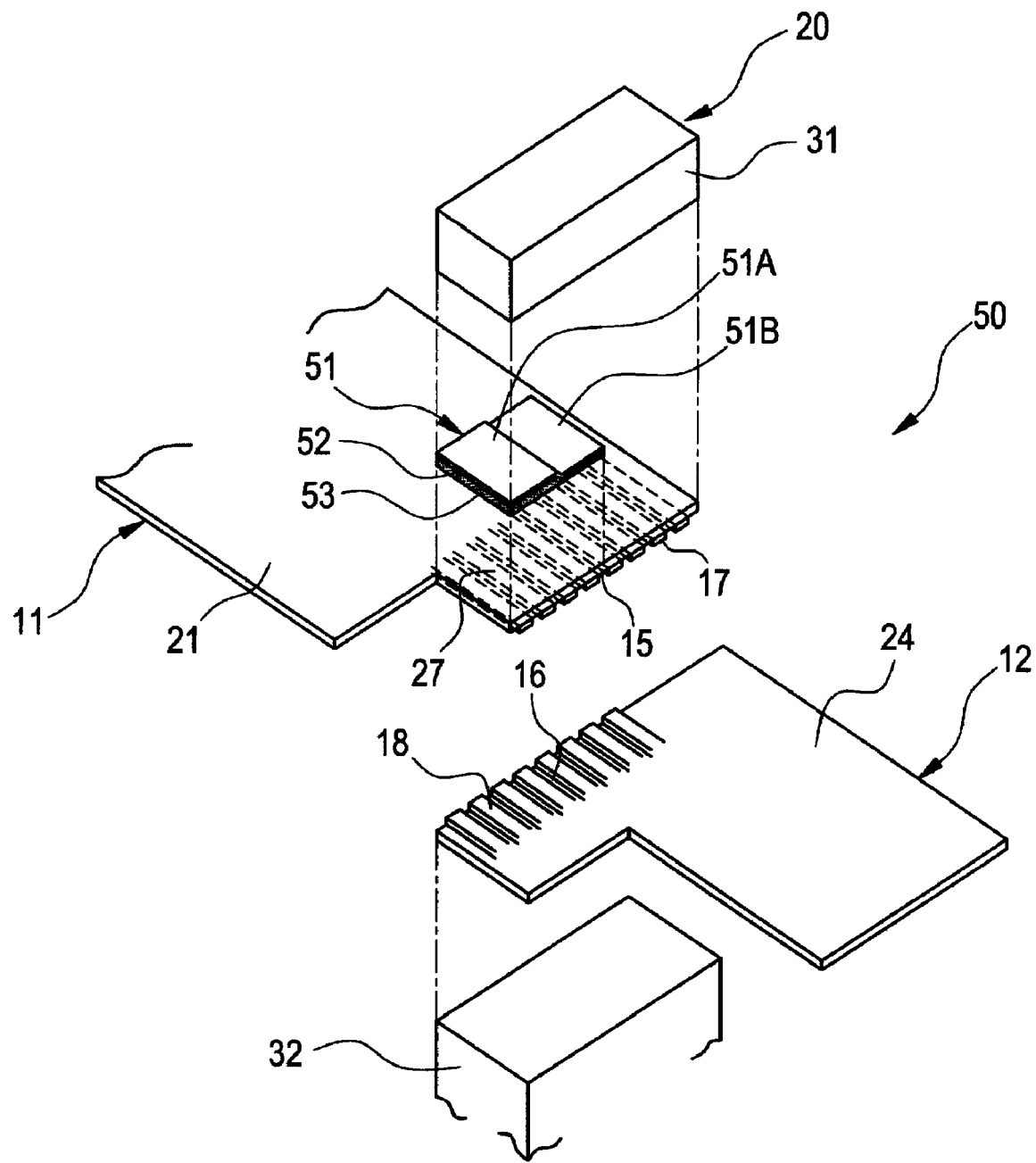
FIG. 5 is an exploded perspective view of a connecting structure of a circuit board according to a third embodiment of the invention.
Figure 6A:
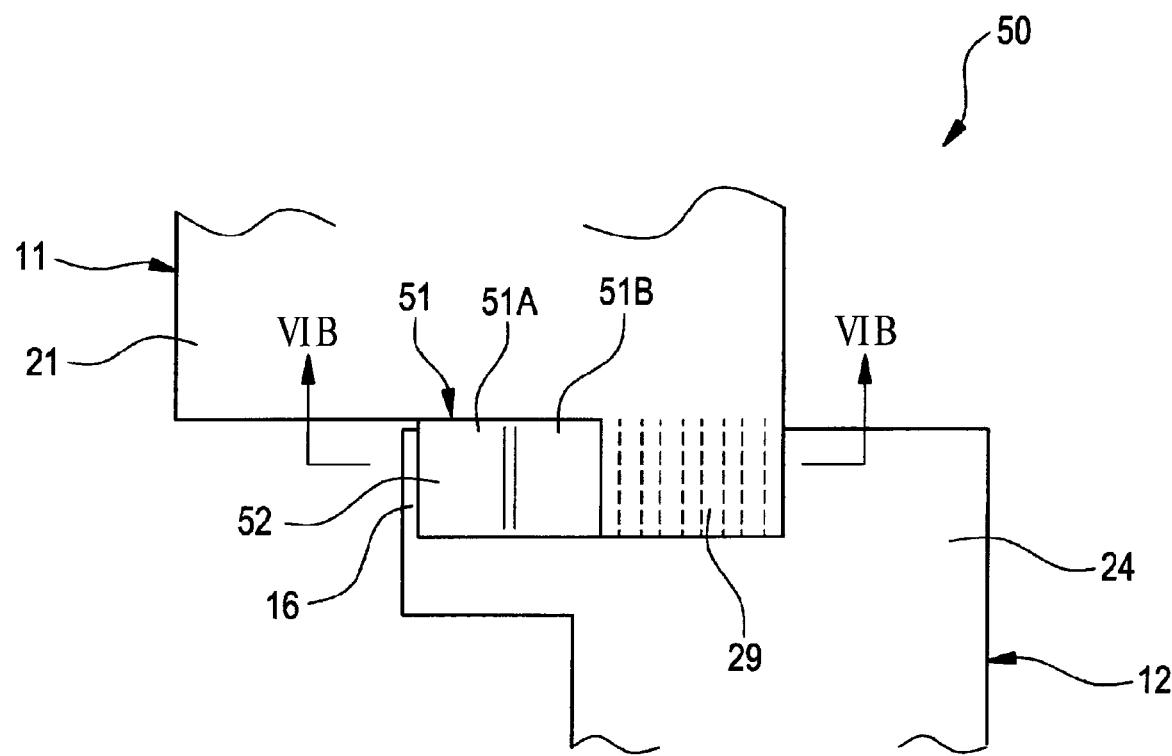
FIG. 6A is a plan view of the connecting structure of the circuit board according to the third embodiment of the invention.
Figure 6B:
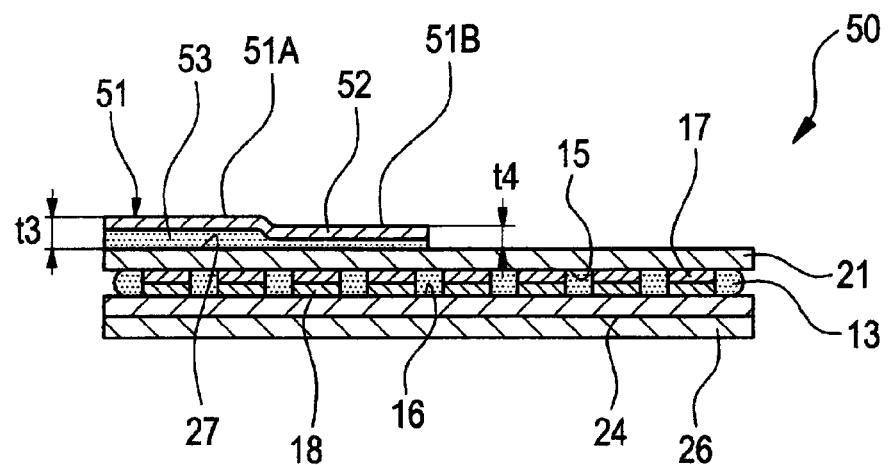
FIG. 6B is a cross-sectional view of FIG. 6A.

As shown in FIGS. 5 and 6, a connecting structure 50 of a circuit board according to the third embodiment uses a heat-insulating layer 51 instead of the heat-insulating layer 28 of the first embodiment. The other configuration is the same as that of the connecting structure 10 of the circuit board according to the first embodiment.

When the first connecting part and the second connecting part are heated and pressure-welded to each other, heat may be confined unevenly in the section where heat is likely to be confined. The heat-insulating layer 51 is thus adjusted to have an uneven thickness dimension.

The heat-insulating layer 51 includes a coverlay 52 bonded to the section 27 where heat is likely to be confined with an adhesive 53. By changing the number of times of application of the adhesive 53 or adjusting the amount of application of the adhesive 53, the thickness dimension of the adhesive 53 is changed.

The heat-insulating layer 51 is formed in two thicknesses, that is, a section 51A having a thickness dimension t3 and a section 51B having a thickness dimension t4. The thickness dimension t3 is larger than the thickness dimension t4 (t3>t4).

The reason the thickness dimension t3 of the section 51A is made larger than the thickness dimension t4 of the section 51B is as follows:

The section 51A having a thickness dimension t3 is more distant from the hard base material 24 than the section 51B having a thickness dimension t4. Thus, the section 51A is more likely to confine heat.

By designing the heat-insulating layer 51 adjustable to an uneven thickness dimension, it is possible to change thermal conductivity in a phased manner and more favorably alleviate a temperature difference between the first connecting part 15 and the second connecting part 16.

It is thus possible to more favorably prevent the first circuit patterns 17 and the second circuit patterns 18 from being displaced and more favorably suppress variations in temperature of heat transmitted to an adhesive 13.

Fourth Embodiment

Figure 7:
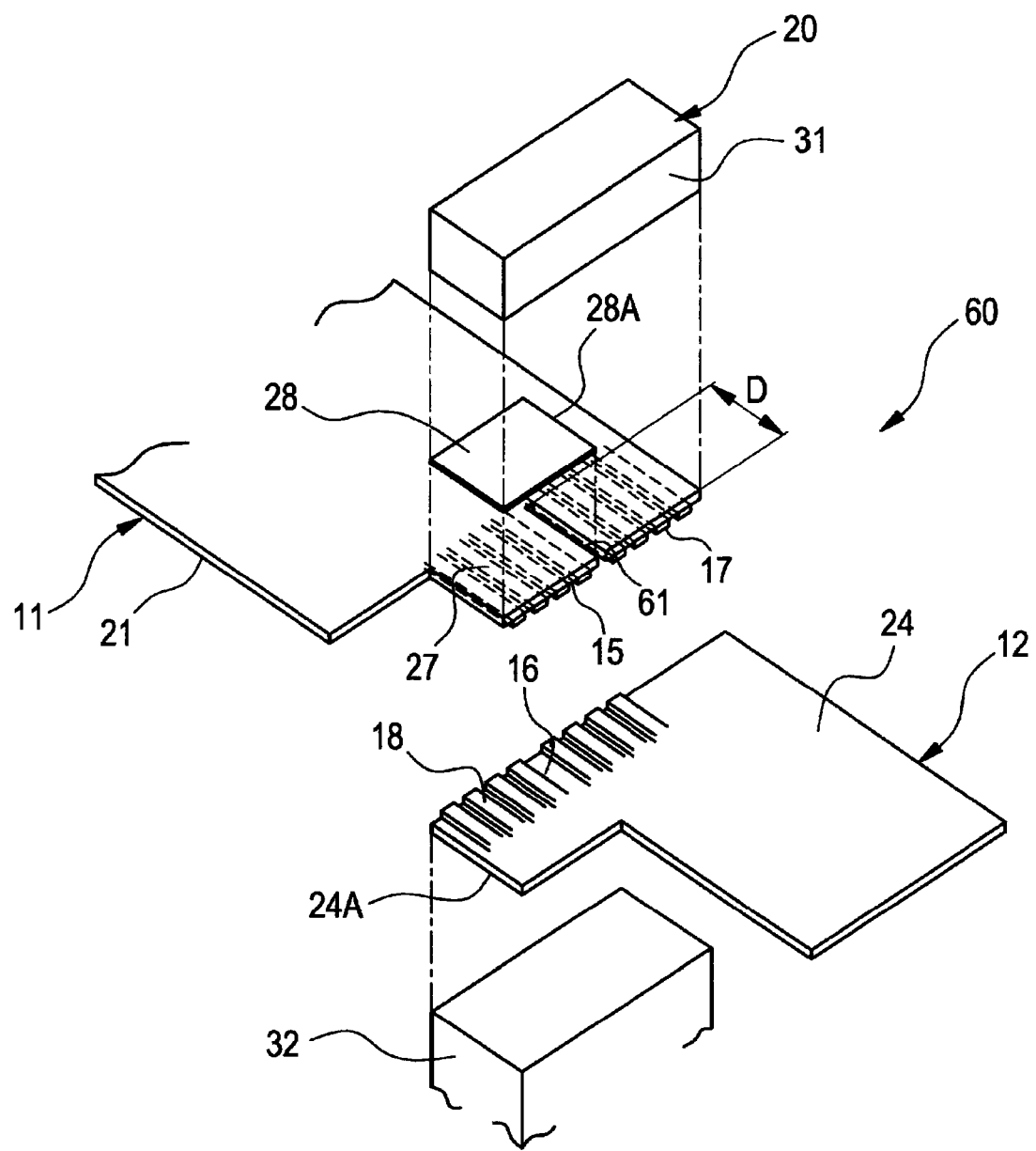
FIG. 7 is an exploded perspective view of a connecting structure of a circuit board according to a fourth embodiment of the invention.
Figure 8A:
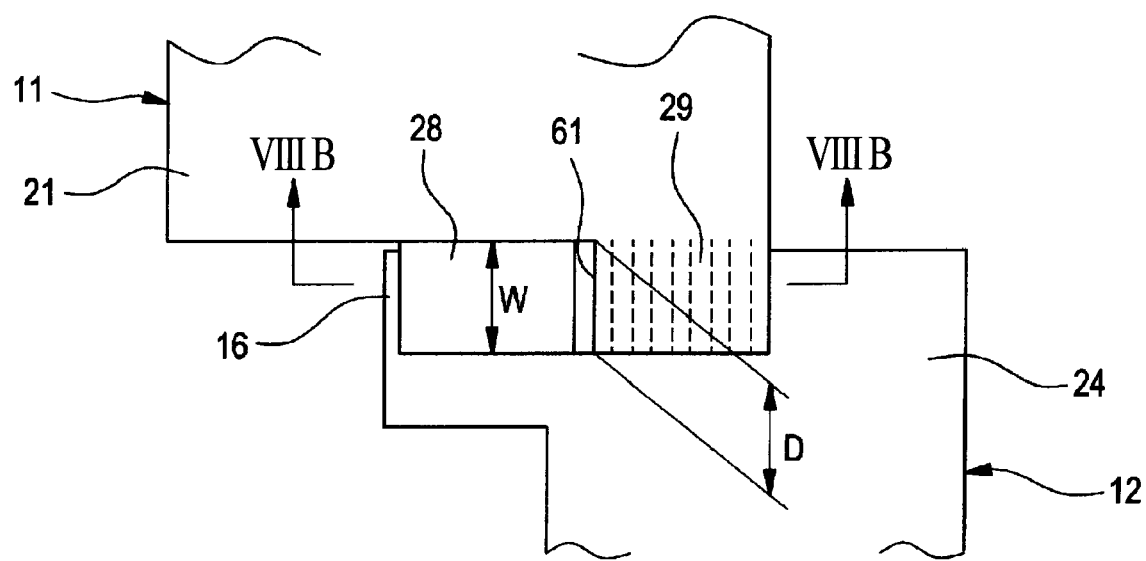
FIG. 8A is a plan view of the connecting structure of the circuit board according to the fourth embodiment of the invention.
Figure 8B:
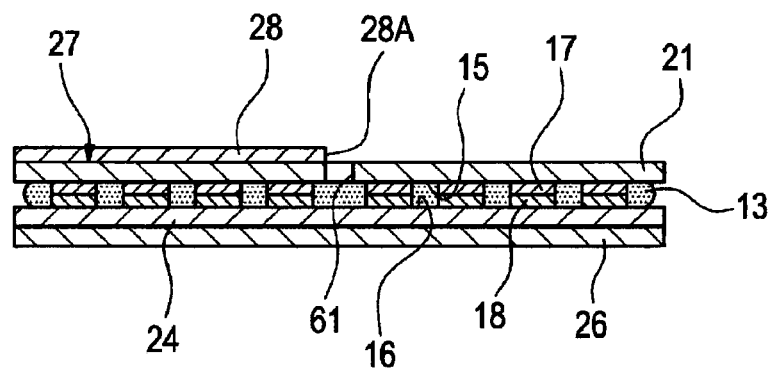
FIG. 8B is a cross-sectional view of FIG. 8A.
Figure 9:
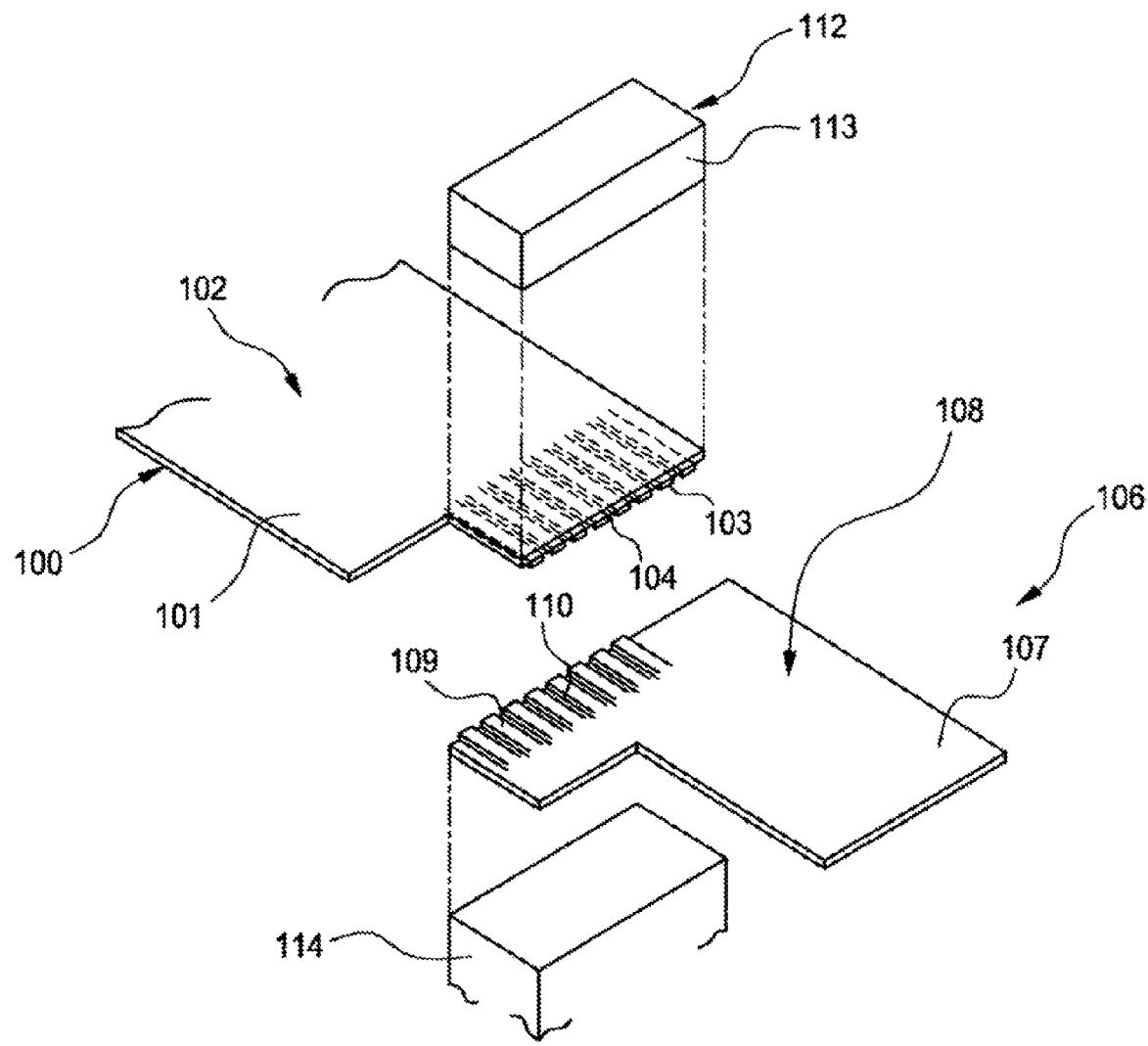
FIG. 9 is an exploded perspective view of a connecting structure of a circuit board according to the related art.
Figure 10:
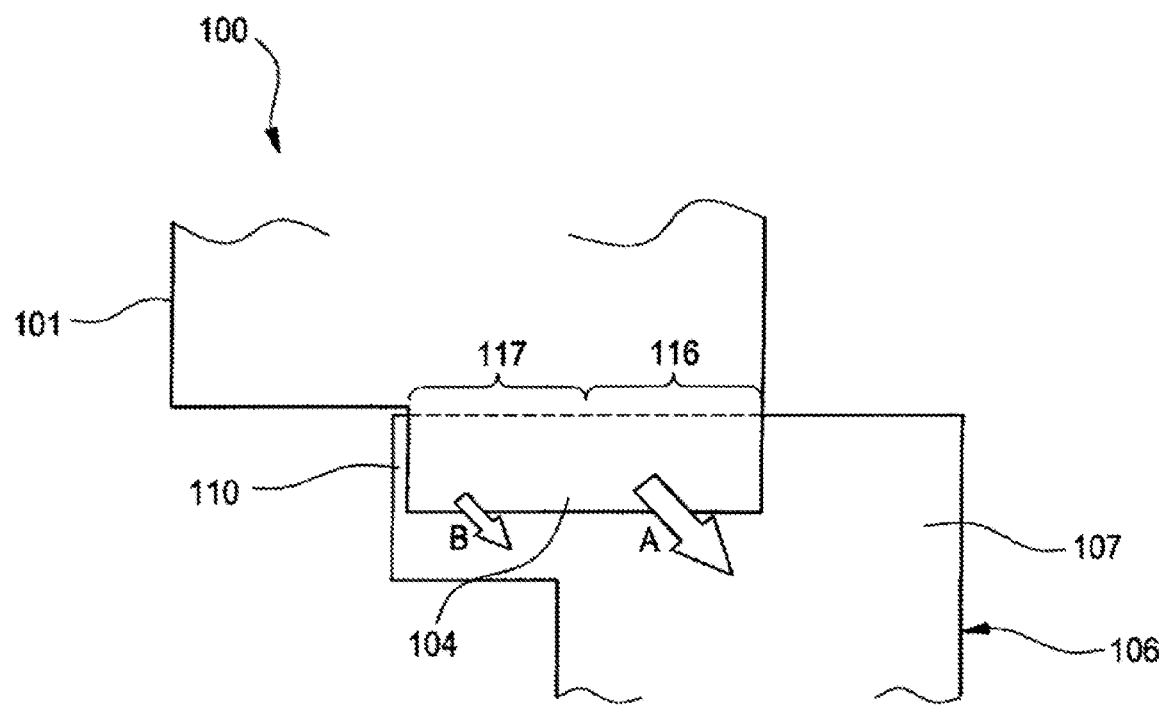
FIG. 10 explains the heat transfer state of the connecting structure of a circuit board according to the related art.

As shown in FIGS. 7 and 8, a connecting structure 60 of a circuit board according to the fourth embodiment includes a slit 61 formed in a soft base material 21 so as to correspond to the end of the heat-insulating layer 28 according to the first embodiment. The other configuration is the same as that of the connecting structure 10 of the circuit board according to the first embodiment.

The slit 61 is formed between the first circuit patterns 17. A slit depth D is formed almost the same as the width W of the heat-insulating layer 28.

Same as the first embodiment, on the rear surface 21B of the soft base material 21, a heat-insulating layer 28 is arranged only in a part 27 of the region corresponding to the first connecting part 15, that is, in the section 27 distant from the hard base material 24.

This makes it difficult for the heat from the pressurizing jig 20 to be transmitted to the section 27 distant from the hard base material 24. This suppresses a rise in temperature in the section 27 distant from the hard base material 24 thus alleviating a temperature difference between the first connecting part 15 and the second connecting part 16.

This prevents the first circuit patterns 17 and the second circuit patterns 18 from being displaced and suppresses variations in temperature of heat transmitted to the adhesive 13.

Further, by forming a slit 61 in the soft base material 21 so as to correspond to the end 28A of the heat-insulating layer 28, heat is shielded by the slit 61 and kept from being transmitted to the section 27 where heat is likely to be confined. This more favorably alleviates a temperature difference between the first connecting part 15 and the second connecting part 16.

Even in case the first connecting part 15 of the soft base material 21 is excessively softened in part and unnecessarily drawn by pressurization and the extension of the first connecting part 15 is uneven due to variations in temperature under hot pressure welding, it is possible to absorb extension of the first connecting part 15 with the slit.

This prevents accumulation of extension of the first connecting part 15 thus suppressing displacement of the first circuit patterns 17 and the second circuit patterns 18.

INDUSTRIAL APPLICABILITY

The present invention preferably applies to a connecting structure of a circuit board subjected to hot pressure welding with an adhesive interposed between a connecting part of a first circuit board and a connecting part of a second circuit board, the connecting part of each of the circuit boards forming the circuit board, and an electronic device using the connecting structure of the circuit board.

The invention claimed is:

1. A connecting structure of a circuit board, comprising:
a first circuit board and a second circuit board each including a connecting part where plural circuit patterns are arranged in parallel on a front surface of a base material,
wherein the connecting parts are opposedly disposed via an adhesive and the connecting parts are pinched by a pair of pressurizing jigs for hot pressure welding of the connecting parts so that the circuit patterns are in contact with each other;
wherein one of the boards is a soft base material; and
wherein a heat-insulating layer, which has lower thermal conductivity than the soft base material, is provided on only a part of a region corresponding to the connecting part on a rear surface of the soft base material.

2. The connecting structure of the circuit board according to claim 1, wherein the heat-insulating layer has an uneven thickness dimension.

3. The connecting structure of the circuit board according to claim 1, wherein a slit is formed in the soft base material so as to correspond to the end of the heat-insulating layer.

4. A connecting part of a circuit board, wherein plural circuit patterns are arranged in parallel on a front surface of a soft base material; and
wherein a heat-insulating layer, which has lower thermal conductivity than the soft base material, is provided on only a part of a region corresponding to the connecting part on a rear surface of the soft base material.

5. An electronic device using the connecting structure of the circuit board according to claim 1.

6. An electronic device using the connecting part of a circuit board according to claim 4.

* * * * *